United States Patent [19]
Perkins

[11] Patent Number: 5,420,639
[45] Date of Patent: May 30, 1995

[54] RATE ADAPTIVE HUFFMAN CODING

[75] Inventor: Michael G. Perkins, Lawrenceville, Ga.

[73] Assignee: Scientific-Atlanta, Inc., Norcross, Ga.

[21] Appl. No.: 41,670

[22] Filed: Apr. 1, 1993

[51] Int. Cl.[6] .............................................. H04N 7/32
[52] U.S. Cl. .................................... 348/418; 348/422
[58] Field of Search ............... 348/414, 417, 418, 422; 358/427; 341/65; H04N 7/130, 7/137

[56] References Cited

U.S. PATENT DOCUMENTS

| 4,839,724 | 6/1989 | Keesen et al. | 348/418 |
| 5,136,663 | 8/1992 | Nishio | 348/422 |
| 5,172,228 | 12/1992 | Israelsen | 358/133 |
| 5,194,950 | 3/1993 | Murakami et al. | 348/418 |
| 5,231,485 | 7/1993 | Israelsen et al. | 348/422 |

Primary Examiner—Howard W. Britton
Assistant Examiner—Richard Lee
Attorney, Agent, or Firm—Woodcock, Washburn, Kurtz, Machiewicz & Norris

[57] ABSTRACT

Methods for compressing data in a system employing vector quantization (VQ) and Huffman coding comprise: First, quantizing an input vector by representing the input vector with a VQ codevector selected from a VQ codebook partitioned into subsets, wherein each subset comprises codevectors and each codevector is stored at a corresponding address in the VQ codebook. Next, generating a rate dependent Huffman codeword for the selected codevector, wherein the rate dependent Huffman codeword identifies the subset of the VQ codebook in which the selected codevector is stored. And finally, generating a substantially rate independent Huffman codeword for the selected codevector, wherein the substantially rate independent Huffman codeword identifies a particular VQ codevector within the subset identified by the rate dependent Huffman codeword.

12 Claims, 4 Drawing Sheets

RATE ADAPTIVE HUFFMAN CODING

FIELD OF THE INVENTION

The present invention relates generally to the fields of digital television and vector quantization, and more particularly relates to a rate adaptive Huffman coding technique.

BACKGROUND OF THE INVENTION

The background of the present invention is described herein in the context of pay television systems, such as cable television and direct broadcast satellite (DBS) systems, that distribute program material to subscribers. However, the invention is by no means limited thereto except as expressly set forth in the accompanying claims. The following description of the background of the present invention is derived from commonly assigned U.S. Pat. No. 5,172,228 (application Ser. No. 794,516, issued Dec. 15, 1992), titled *Image Compression Method and Apparatus Employing Distortion Adaptive Tree Search Vector Quantization*, which is hereby incorporated by reference as if fully set forth herein.

Cable television operators receive much of their program material from remote earth stations via a plurality of geosynchronous orbit satellites. Typically, the cable operator selects the program material to be made available to its subscribers by making arrangements with the satellite distributors of that program material. Each cable operator then distributes the selected program material to its subscribers, via a coaxial cable distribution system, from its cable head-end where the material is received from the satellite. Frequently, cable operators also provide their own local programming at the site of the head-end, and further include network broadcasts as well. In DBS applications, each subscriber is capable of receiving a satellite down-link directly.

Digital image transmission combined with data compression techniques may be employed to maximize the amount of information that can be transmitted. Lossless compression techniques, such as Huffman coding, offer, at best, compression ratios of 2.5 to 1 and do not sufficiently compensate for the amount of data expansion that occurs in converting data from analog to digital form. A number of lossy compression techniques have been investigated for digital image compression. DCT (discrete cosine transform) is one known method. Another method, vector quantization (VQ), has shown promise for offering high compression ratios and high fidelity image reproduction. As described below, a combination of Huffman coding and VQ may be employed to achieve greater compression than either method is capable of achieving by itself.

Compression of video images by vector quantization is a two-step process. First, the values to be quantized, for example, the luma and chroma intensity samples composing a video frame, are divided into small non-overlapping blocks referred to as "vectors." Each vector is then approximated by a vector belonging to a set of vectors referred to as the "VQ codebook." The number of vectors in the VQ codebook is generally much smaller than the number of values the vector being quantized could theoretically assume.

Before quantizing an image, a vector quantizer stores a set of codevectors in a memory called a "codebook." Codevectors are vectors chosen to be representative of commonly found image vectors. The quantizer stores a sufficient variety of codevectors in the codebook so that at least one closely matches each of the many image vectors that might be found in the full image.

Each codevector is assigned a unique identification code, sometimes called a "label." In practice, the labels are the memory addresses of the codevectors in the encoder's and decoder's memory. Compression is achieved by sending the address of the codevector that most nearly approximates the vector being quantized. Compression results because, typically, the length of the label is much smaller than the size of the image vector being quantized. As described below, the VQ codebook addresses may themselves be compressed by replacing the most frequently addressed addresses with shorter codewords. This is the idea behind Huffman coding.

Reconstruction of the original full image at the receiver (or at least a very close approximation of the original image) may be accomplished by a device which has a VQ codebook identical to the VQ codebook at the transmitter end of the system. In addition, an identical Huffman codebook would be employed in systems combining VQ and Huffman coding. Generally, the reconstructed image differs somewhat from the original image because codevectors do not usually precisely match the image vectors. The difference is called "distortion." Increasing the size of the codebook generally decreases the distortion.

FIG. 1 depicts an exemplary application of a vector quantization image compression system wherein moving image data is communicated from a point of origin 12 to receiving locations such as 14 or 16. Typically, the point of origin 12 might include a source 20 of program material that supplies movies, and the like in analog form to an apparatus (encoder) 22 for digitization and data compression by vector quantization. Compressed, digitized data is transmitted to a satellite 18 via transmitter 24 for reception by a plurality of earth stations 14 or 16. The earth stations 14, 16 may be the head-end of a cable television distribution system of the type which receives signals from the satellite 18 and distributes them to a plurality of subscribers via coaxial cable. Alternatively, one or more of the earth stations may be DBS (direct broadcast satellite) subscribers who receive signals directly from the satellite 18. The cable head-end installation 14 may receive the data transmitted by the station 12 via receiver 26, then employ an on-site apparatus (decoder) 28 for decompressing the received data and converting the same back to analog form. Another on-site apparatus 30 may convert the analog data to conventional NTSC signals for transmission over the cable to subscribers in conventional form. Thus, in the case of cable head-end installation 14, the cable head-end operator distributes analog NTSC cable television signals to subscribers in conventional form.

Many different techniques for searching a VQ codebook to find the codevector that best matches the image vector have been proposed, but generally the methods can be classified as either a full search technique or a tree search technique. In a full search technique, the vector quantizer sequentially compares an input image vector to each and every codevector in the codebook. The vector quantizer computes a measure of distortion for each codevector and selects the one having the smallest distortion. The full search technique ensures selection of the best match, but involves the maximum number of computational steps. Thus, while distortion can be minimized using a full search technique, it is computationally expensive. The tree search technique reduces the number of codevectors that must be evaluated but generally does not guarantee that the minimum distortion vector will be selected. A tree search technique can be considered as one that searches a sequence of small codebooks instead of one large codebook. As described below, the codebook structure can be depicted as a tree and each search and decision corresponds to advancing one level or stage in the tree, starting from the root of the tree. The tree search technique is sometimes referred to as "tree-search vector quantization", "tree-search VQ" and "TSVQ." The tree-search technique has found favor for compressing dynamic images, since it is computationally faster. However, since tree search VQ does not guarantee selection of the optimum vector, it requires a larger codebook to achieve the same distortion as full search VQ.

The process of vector quantization can be either fixed rate or variable rate. Fixed rate VQ occurs when the transmitted codevector labels associated with a given image vector all have the same length. In contrast, in a variable rate VQ system, the labels associated with each codevector have different lengths. Hence, it takes more bits to represent some codevectors than others.

Several techniques are available for implementing variable rate VQ. In one technique, the quantity of compressed data generated by an image depends on the image content. For example, a variable rate VQ system might employ two different vector sizes. A large vector size (e.g., a 4×4 block of pixels) might be used to describe simple parts of the image, and a small vector size (e.g., a 4×2 block) might be used to describe complex parts of the image. The amount of compressed data generated depends on the complexity of the image.

FIG. 2 graphically illustrates the structure of an exemplary tree search VQ codebook. The construction and use of tree search codebooks to perform vector quantization is well known in the art. The exemplary tree search VQ codebook of FIG. 2 comprises a plurality of levels 0–5 of codevectors wherein level 0 is defined by a root node N0 of the tree and subsequent levels are defined by additional nodes N1–N63 that are reached as branches of the tree are traversed. Each node is actually a codevector. Therefore, the exemplary codebook of FIG. 2 has 64 codevectors N0–N63. The codevectors are stored in a memory M and each codevector has an associated address which serves as the ID code, or label. Compression results because the address length is typically much shorter than the length or size of each codevector.

In a typical tree search VQ codebook, the codevectors at each successive level of the tree represent possible input vectors with greater accuracy than codevectors at a preceding level. Thus, the codevectors at level 5 of the exemplary tree of FIG. 2 may represent possible input vectors with greater accuracy than the codevectors at level 4, and the codevectors at level 4 may represent possible input vectors with greater accuracy than the codevectors stored at level 3, and so on. Such a tree search vector quantization codebook structure is well known in the art.

Vector quantization is commonly but not always carried out by searching each input vector all the way through to the bottom of the tree to find the codevector at the bottom of the tree that most closely resembles the input vector. According to the invention described in U.S. Pat. No. 5,172,228 (application Ser. No. 794,516, issued Dec. 15, 1992), the maximum level of the tree to which a search is carried out varies according to a variable threshold. More particularly, the level of the tree to which each search is carried out is governed by a measure of distortion between each input vector and the best match codevector at a particular level, and comparing the distortion measure to the threshold. If the distortion measure is less than the threshold, the codevector at that particular level is selected. However, if the distortion measure is greater than the threshold, then the best match codevector at the next level of the tree is selected, and the process is repeated until the distortion measure is less than the threshold, or until the last level of tree has been reached. Further, the threshold varies according to a "fullness measure" of a buffer that stores VQ data to be transmitted, which, in effect, causes the threshold to vary as a function of the average length of VQ data stored in the buffer. Alternatively, a threshold value may be derived and fixed for a predetermined number of images which causes those particular images to generate a fixed amount of compressed data.

FIG. 3 illustrates a VQ encoder apparatus for carrying out this method. As shown, an input vector is received and supplied to a circuit 102 which computes the mean value of the input vector. The mean value is supplied on a line 124 to the minus ("−") input of an adder circuit 104 which also receives data on a plus ("+") input, via line 103. The mean value is also supplied to a Huffman encoder circuit 120. The adder circuit 104 subtracts the mean value from the input vector to supply, on a line 122, a residual vector, which is the input vector with its mean value removed. The residual vector is used for searching the codebook to select a best match codevector.

As shown, the mean value is also provided on line 124 to one input of a mean value to input vector difference calculator 106, and the input vector is also provided on line 103 to another input of calculator 106. The calculator 106 calculates a measure of difference between the mean value and input vector. This may be performed by converting the mean value to a vector, then computing a measure of difference between the mean vector and input vector by any well known technique, such as by computing the absolute difference of the vectors, or by computing the square root of the difference between the squares of the two vectors. Also supplied as an input to the calculator 106, on line 128, is a threshold value whose magnitude is determined as described in the above-cited U.S. Pat. No. 5,172,228 (application Ser. No. 794,516, issued Dec. 15, 1992). The calculator 106 determines whether the difference between the mean value and the input vector is less than or greater than the threshold value. The result of this decision is reported, via line 107, to a variable depth controller 108. The controller 108 is responsible for carrying out vector quantization of each residual vector. If the difference between the mean value and the input vector is less than the threshold, the variable depth controller 108 does not carry out vector quantization for this particular input vector. If the difference exceeds the threshold, the controller 108 carries out vector quantization by conducting a search for the codevector that best matches the residual vector.

The residual vector calculated by adder 104 is provided via line 122 to a residual vector buffer 110. In the event vector quantization is indicated by the output 107 of the calculator 106, the residual vector is provided to a codebook processor 112 via line 140. The codebook processor 112 bi-directionally communicates with a tree structured VQ codebook 114 via a pair of lines 146. The residual vector is compared to the codevectors at each level as the codebook 114 is traversed. The codebook processor 112 provides, on a line 142, the address of the best match codevector and also provides, on a line 144, a measure of distortion between the current best match codevector and the current residual vector.

The variable depth controller 108 provides, on a line 126, the address of a finally selected codevector from the codebook 114. This address is preferably provided to the input of a Huffman encoder 120. The mean value provided by the calculator 102 is also provided to the Huffman encoder. When the measure of difference between the mean value and input vector calculated by calculator 106 is less than the threshold, then only the mean value is supplied to the Huffman encoder 120, i.e., vector quantization for this particular input vector is not performed and therefore no address data is provided on line 126 to the Huffman encoder 120. In such event, the Huffman encoder will indicate to the receiver that only the mean value has been transmitted for this particular input vector. Both the VQ data (address) from the controller 108 and the mean value from calculator 102 are provided to the Huffman encoder 120. (Note: Whether or not the VQ is "variable length VQ" is determined by whether Huffman coding is used or the raw equal length addresses are sent to the decoder. Of course, if Huffman coding is not used, the search will always go to the bottom of the tree and never stop at any other level.)

Huffman encoders are well known in the art. While many different variations of Huffman encoders are known, all operate on essentially the same principle. A Huffman encoder is a lossless data compressor that, using a lookup table, assigns separable compression codes (addresses) based on the statistical probability that a particular entry in the lookup table will be addressed. That is, the greater the probability that a particular entry in the lookup table will be addressed, the shorter the compression code. Thus, the function of the Huffman encoder is to assign compression codes to each address received on line 126, wherein the compression code assigned to each address has a length that depends on a predetermined probability that the codevector associated with that address will be selected from the codebook 114.

It will be appreciated by those skilled in the art that vectors located at higher (i.e., upper) levels of the tree typically occur with more frequency than those at lower levels of the tree, although this depends on the data rate. The Huffman encoder assigns codewords based on the frequency of occurrence of a particular address. The Huffman encoder therefore chooses variable length codes based on frequency of occurrence, and generates variable rate data.

A problem with the prior art is that the Huffman code employed in the VQ system is fixed for all rates. This is clearly suboptimal since, the higher the rate, the deeper into the VQ TSCB the selected codevector will lie. The Huffman code should change to reflect this. However, redesigning the Huffman code for the entire VQ codebook would be impractical. Accordingly, a primary goal of the present invention is to provide an optimal or near optimal way to design Huffman codes for TSVQ and other VQ systems such that the encoder and decoder can operate at various data rates, yet cost-efficiently adapt their Huffman coding strategy to each data rate. A further goal of the present invention is to provide a Huffman code especially suited for variable rate VQ systems employing a TSCB.

SUMMARY OF THE INVENTION

According to the present invention, a method for compressing data comprises the steps of: quantizing an input vector by representing the input vector with a VQ codevector selected from a VQ codebook partitioned into subsets, wherein each subset comprises codevectors and each codevector is stored at a corresponding address in the VQ codebook; generating a rate dependent Huffman codeword for the selected codevector, wherein the rate dependent Huffman codeword identifies the subset of the VQ codebook in which the selected codevector is stored; and generating a substantially rate independent Huffman codeword for the selected codevector, wherein the substantially rate independent Huffman codeword identifies a particular VQ codevector within the subset identified by the rate dependent Huffman codeword. For example, different Huffman codes for the subsets are stored, one for each rate (or rate region) at which the encoder and decoder will operate. The number of subsets is normally substantially smaller than the total number of codevectors, so it is reasonable to store several subset Huffman codes, whereas it is unreasonable to store several Huffman codes that span the entire set of codevectors.

In one preferred embodiment of the invention, the VQ codebook is a tree structured codebook and the subsets correspond to levels of the TSCB. The Huffman codebook is characterized in that the length of each rate dependent Huffman codeword is inversely related to the probability that the selected VQ codevector will be within the subset identified by that codeword. Further, the length of each substantially rate independent Huffman codeword is generally inversely related to the probability that the particular VQ codevector identified by that codeword will be selected. In addition, the subsets may correspond to different VQ codebooks. The latter feature is especially appealing where different block sizes are employed to encode the input vectors.

The present invention also provides a system for compressing data comprising a VQ codebook partitioned into subsets, wherein each subset comprises codevectors and each codevector is stored at a corresponding address in the VQ codebook; means for quantizing an input vector by representing the input vector with a VQ codeword determined on the basis of a VQ codevector selected from the VQ codebook; means for generating a rate dependent Huffman codeword for the selected VQ codevector, wherein the rate dependent Huffman codeword identifies the subset of the VQ codebook in which the selected codevector is stored; and means for generating a substantially rate independent Huffman codeword for the selected codevector, wherein the substantially rate independent Huffman codeword identifies a particular VQ codevector within the subset identified by the rate dependent Huffman codeword.

The present invention also provides a Huffman codebook for use in performing rate adaptive data compression and decompression. According to the invention, such a codebook comprises a memory storing rate dependent Huffman codewords and substantially rate independent Huffman codewords, wherein the rate dependent Huffman codewords each identify a subset of a VQ codebook and the substantially rate independent Huffman codewords each identify a particular VQ codevector within the subset identified by the rate dependent Huffman codeword. The memory may comprises a semiconductor random access memory (RAM) or a semiconductor read only memory (ROM).

Other features of the present invention are described below.

DETAILED DESCRIPTION OF PREFERRED EMBODIMENTS

Figure 1:
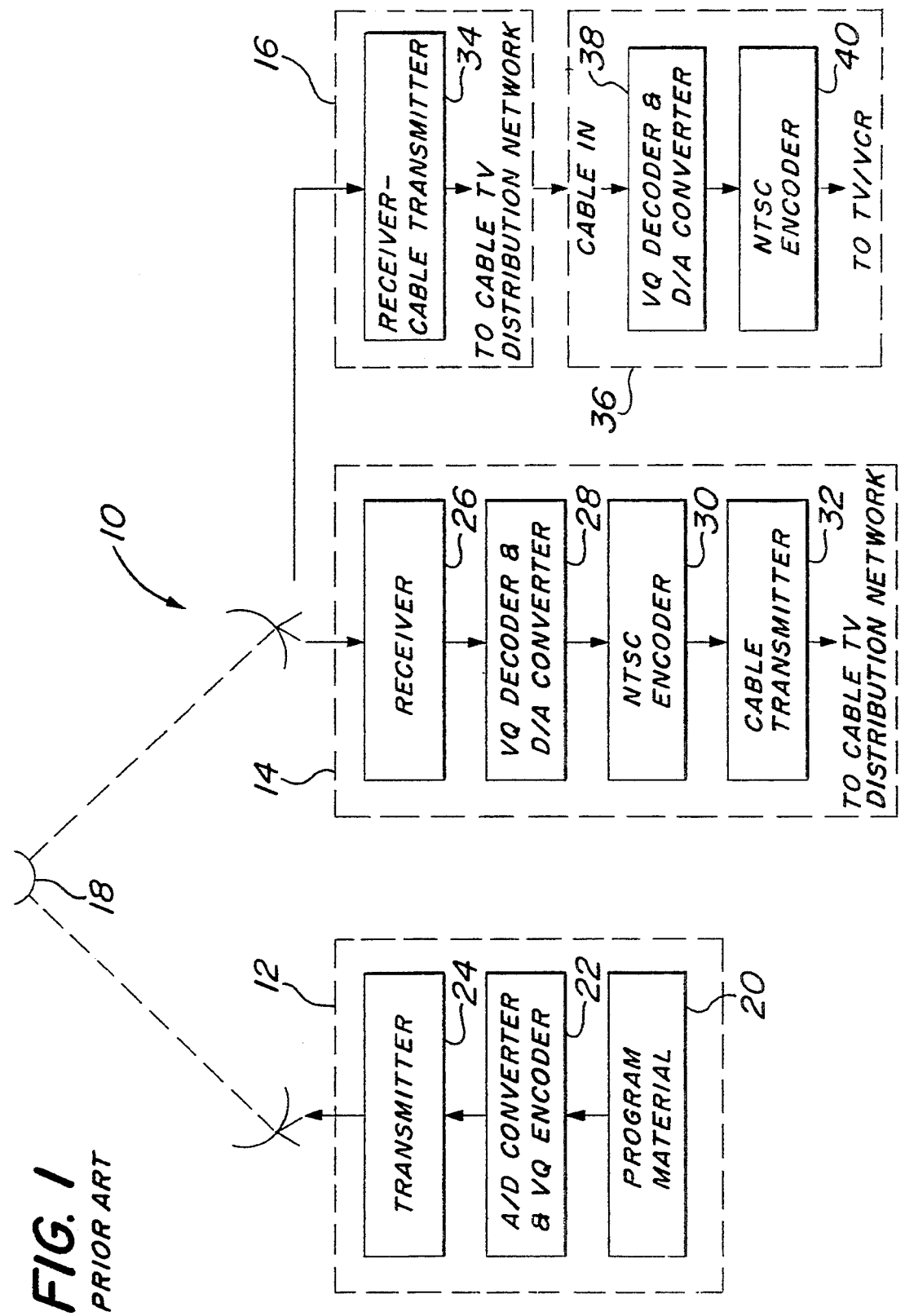
FIG. 1 is a block diagram illustrating an application of the present invention to a pay television system employing satellite communication to transmit program material.
Figure 2:
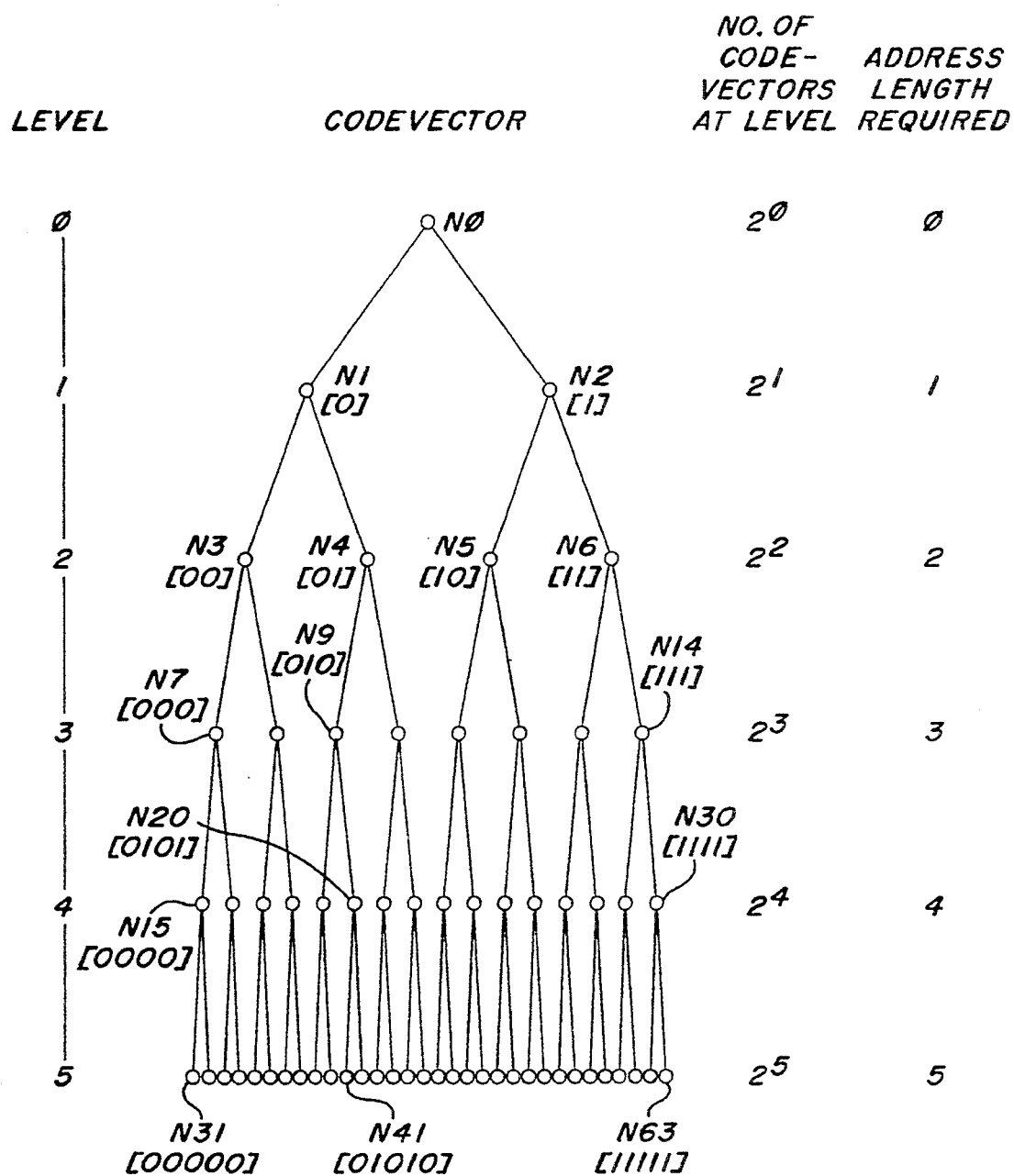
FIG. 2 illustrates the organization of an exemplary tree search VQ codebook that may be employed in connection with the practice of the present invention.
Figure 3:
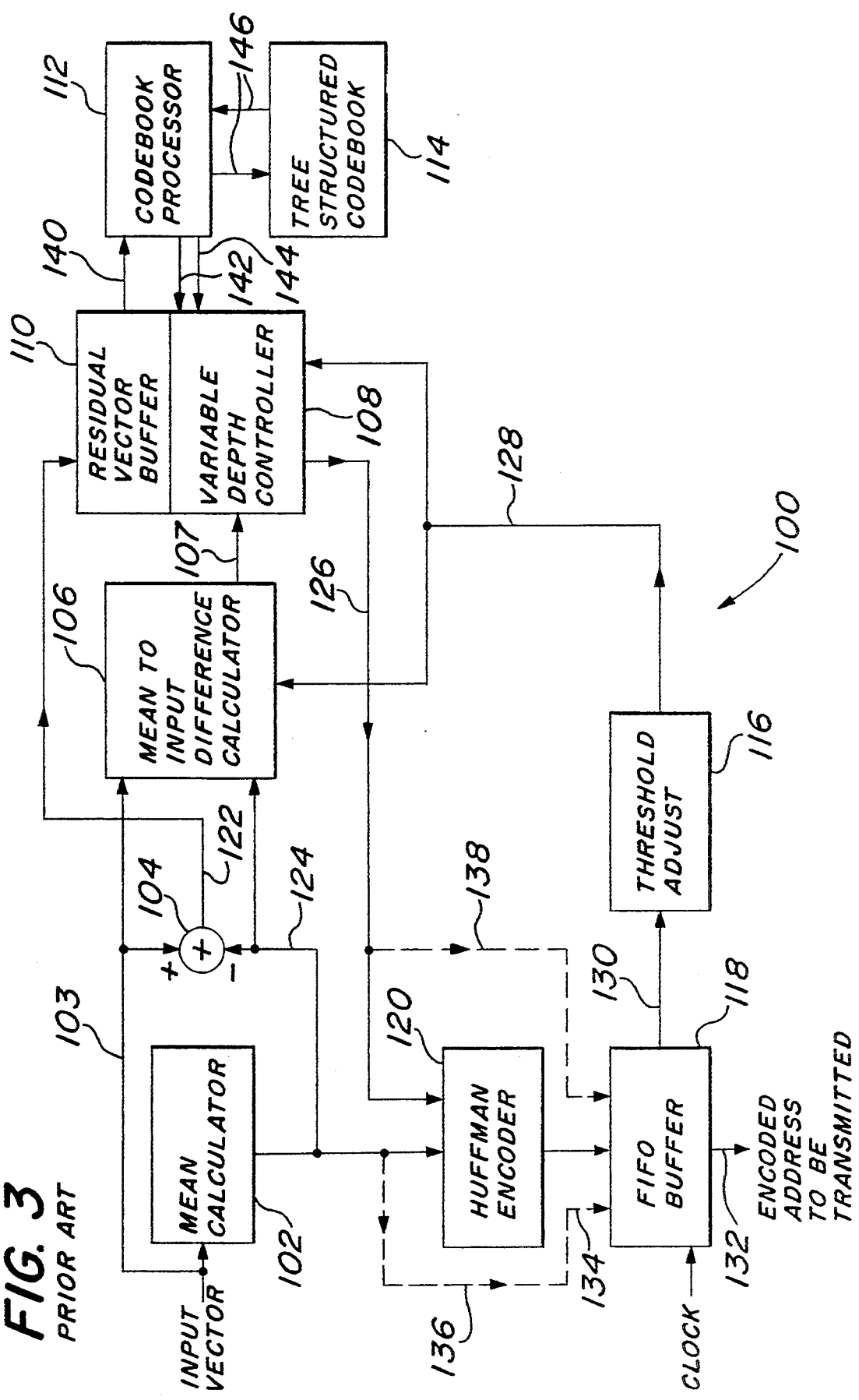
FIG. 3 is a block diagram of one embodiment of an encoder apparatus for carrying out the vector quantization compression method of the present invention.

A large VQ codebook is employed in a preferred embodiment of the present invention. A Huffman code is designed for use with this codebook. The optimal Huffman code is rate dependent. However, since the VQ codebook is large, it is impractical to store a different set of Huffman codewords for every rate. Therefore, according to the present invention, the VQ codebook is partitioned into several subsets. The number of subsets is small in comparison to the total number of vectors in the VQ codebook. The subsets are chosen such that the probability that the selected codevector lies in any particular subset is strongly rate dependent. Moreover, given that the vector chosen lies in a given subset, the probability of its being chosen is rate independent or only weakly rate dependent (described herein as "substantially rate independent"). The Huffman coding process then proceeds as follows:

1. The system determines which subset the chosen codevector lies in.

2. The system issues a "subset" Huffman codeword indicating this subset. This subset Huffman codeword is data rate dependent.

3. The system issues a second Huffman codeword indicating or identifying which codevector within the identified subset was chosen. Thus, associated with each subset is a separate, substantially rate independent Huffman code.

In one example of such a system, the VQ codebook is a tree-structured codebook (TSCB) and the subsets correspond to the levels of the tree. A separate Huffman code is designed for each level of the tree.

A problem with the prior art is that the Huffman code employed in the VQ system is fixed for all rates. This is clearly suboptimal, since, generally, the higher the rate, the deeper into the TSCB the selected codevector will lie. The Huffman code should reflect this. However, it would be impractical to redesign the Huffman code for the entire VQ codebook every time the rate changes. One example of a system that avoids this problem employs a 17-bit codebook of the form 4, 4, 4, 5. This means that there are $2^4$ children of the level 1 "root" node in the tree, $2^4$ children of each node of level 2, $2^4$ children of each node of level 3, and $2^5$ children of each node of level 4. Hence, a total of $4+4+4+5=17$ bits are required to uniquely specify each codevector at the bottom of the tree. Level 1 of the tree has 1 node, level 2 has $2^4=16$ nodes, level 3 has $16*(2^4)=256$ nodes, level 4 has $256*(2^4)=4096$ nodes, and level 5 has $4096*(2^5)=131072$ nodes.

In this example, levels 2 through 5 of the tree are subsets, and we consider conditional update and use of the interpolated mean to be subsets as well, so there are 6 "ways" to code each vector:

1. Conditional update (With conditional update, the system first compares the current input vector with the codevector selected for the previous input vector, and then proceeds to the other codevectors only if the previously selected codevector is unacceptable.)
2. Interpolated mean (With this coding method, the system uses the respective mean values of a block of vectors to estimate the individual pixel values composing each vector, using interpolation.)
3. Stop at one of the 16 nodes on level 2
4. Stop at one of the 256 nodes on level 3
5. Stop at one of the 4096 nodes on level 4
6. Stop at one of the 131072 nodes on level 5

In addition, it should be noted that a different rate-independent Huffman codebook is designed for levels 2, 3, 4, and 5 of the code tree. When the system is operating at a low data rate, or employing conditional update or interpolated mean, the codebook on level 2 will be used considerably more often than when the system is operating at a higher data rate. The rate-dependent codebooks need only store 6 codewords: one for each "way" a vector can be coded. Hence, several such rate-dependent codebooks can be stored, each one tailored to a specific data rate or date rate region.

Another example of a VQ system in accordance with the present invention employs a five level, 20-bit VQ codebook. Since the probability of stopping at any level of the VQ codebook, and hence at any node, or codevector, depends on the rate, a single Huffman code spanning the entire VQ codebook could only be optimized for one rate. According to the present invention, several Huffman codes are employed, each optimized for a different rate. A "type" Huffman code is employed to identify the "way" the 4×4 vector was coded and a subsequent codeword is employed to identify which codevector was chosen.

For yet another example, consider hierarchical VQ using vectors of block sizes 4×4, 4×2, and 4×1. Assume that each codebook is a 6-6-6 codebook, i.e., each codebook has 4 levels; level 1 has 1 node; level 2 has $2^6=64$ nodes; level 3 has $64*(2^6)=4096$ nodes, and level 4 has $4096*(2^6)=262144$ nodes. In hierarchical VQ, if the distortion threshold cannot be satisfied using a codevector from the 4×4 codebook, the 4×4 image block is subdivided into two 4×2 blocks, and the 4×2 codebook is used. Each 4×2 block can be subdivided into two 4×1 blocks if required. There are the following number of ways to code a vector.

| Interpolated Mean | 1 |
| --- | --- |
| Conditional Update | 1 |
| 4 × 4 Vector | 3 |
| 4 × 2, 4 × 2 | 9 |
| 4 × 2, 4 × 1, 4 × 1 | 27 |
| 4 × 1, 4 × 1, 4 × 2 | 27 |
| 4 × 1, 4 × 1, 4 × 1, 4 × 1 | 81 |

Summing the right-hand column, it is apparent that there are 149 ways in which a vector could be coded in such a system. Accordingly, the type codeword would be a number from 1 to 149. After receiving the type codeword, the receiver would know how the vector was coded and at what level of the VQ codebook the corresponding VQ codevector was stored. As before, the type codeword is data rate dependent, and several "type" Huffman codes can be stored as appropriate. In the case at hand, a separate rate-independent Huffman codebook is designed for levels 2, 3, and 4 of the 4×4, 4×2, and 4×1 codebooks. A total of nine rate-independent Huffman codes are employed. These Huffman codes depend on the statistics of video signals and hence do not change as the rate changes.

Huffman code optimization may be performed by first using a long training sequence to descend the TSCB to the bottom, and computing for every node in the tree the probability that that node will be traversed. These statistics would then be used to design any Huffman codes that span codebook levels. Next, starting with some initial guess of the type-code for the rate of interest, new statistics would be gathered, e.g., from actual video, for the various ways a vector could be coded. With these statistics, a new Huffman code would be designed. With some iteration, the latter code would converge.

Figure 4:
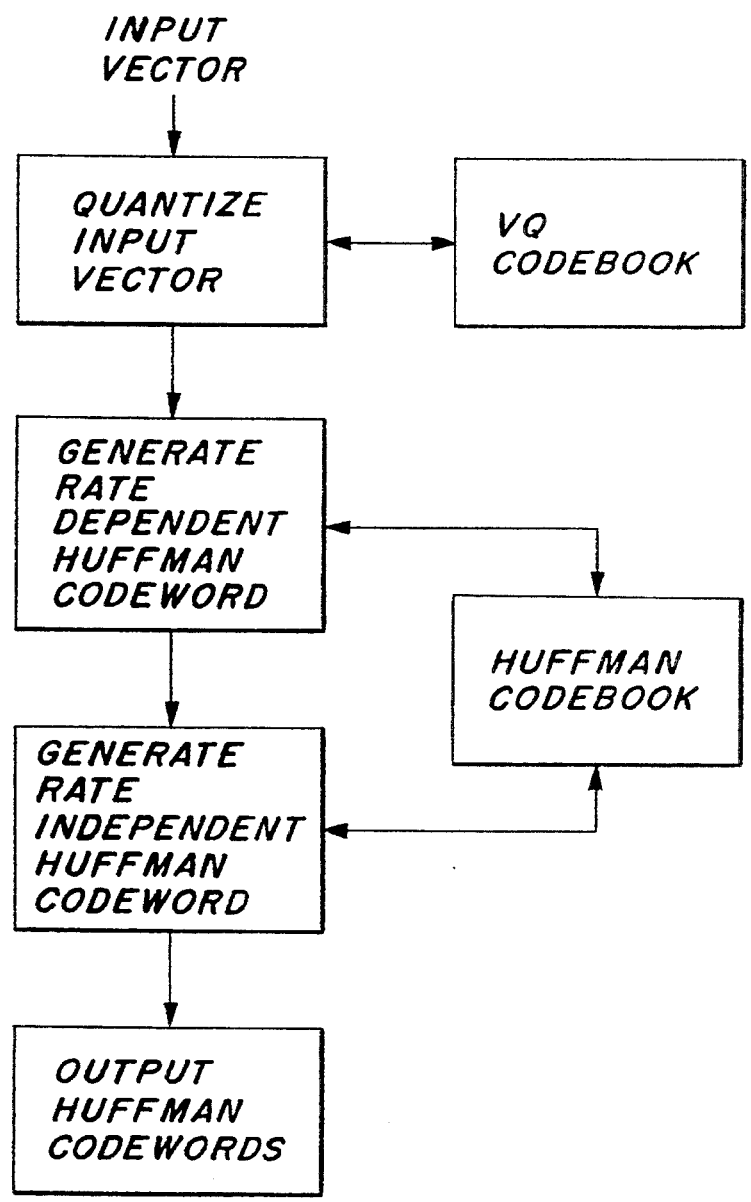
FIG. 4 is a flowchart of a method for compressing data in accordance with the present invention.

FIG. 4 is a flowchart of a method for compressing data in accordance with the present invention. The first step of the inventive method involves quantizing an input vector by representing the input vector with a VQ codevector selected from a vQ codebook. The VQ codebook is partitioned into subsets, wherein each subset comprises codevectors and each codevector is stored at a corresponding address in the VQ codebook. The second step involves generating a rate dependent Huffman codeword for the selected codevector. The rate dependent Huffman codeword identifies the subset of the VQ codebook in which the selected codevector is stored. The third step involves generating a substantially rate independent Huffman codeword for the selected ,codevector. The substantially rate independent Huffman codeword identifies a particular VQ codevector within the subset identified by the rate dependent Huffman codeword. For example, different Huffman codes for the subsets are stored, one for each rate (or rate region) at which the encoder and decoder will operate. The number of subsets is normally substantially smaller than the total number of codevectors, so it is reasonable to store several subset Huffman codes, whereas it is unreasonable to store several Huffman codes that span the entire set of codevectors. The fourth step involves outputting the Huffman codewords, e.g., transmitting the codewords to a decoder.

I claim:

1. A method for compressing data, comprising the steps of:
   (a) quantizing an input vector by representing said input vector with a vector quantization (VQ) codevector selected from a VQ codebook partitioned into subsets, wherein each subset comprises codevectors and each one of said codevectors is stored at a corresponding address in said VQ codebook;
   (b) generating a rate dependent Huffman codeword for the selected codevector, wherein said rate dependent Huffman codeword identifies the subset of said VQ codebook in which the selected codevector is stored; and
   (c) generating a substantially rate independent Huffman codeword for the selected codevector, wherein said substantially rate independent Huffman codeword identifies a particular VQ codevector within the subset identified by said rate dependent Huffman codeword.

2. The method recited in claim 1, wherein the VQ codebook is a tree structured codebook (TSCB) and the subsets correspond to levels of the TSCB.

3. The method recited in claim 1, wherein the steps of generating a rate dependent Huffman codeword and generating a substantially rate independent Huffman codeword comprise reading codewords from a Huffman codebook.

4. The method recited in claim 3, wherein said Huffman codebook is characterized in that the length of each said rate dependent Huffman codeword is generally inversely related to the probability that the selected VQ codevector will be within the subset identified by that codeword; and the length of each said substantially rate independent Huffman codeword is generally inversely related to the probability that the particular VQ codevector identified by that codeword will be selected.

5. The method recited in claim 1, wherein the subsets correspond to different VQ codebooks.

6. The method recited in claim 1, wherein:
   (1) the VQ codebook is a tree structured codebook (TSCB) and the subsets correspond to levels of the TSCB;
   (2) the steps of generating a rate dependent Huffman codeword and generating a substantially rate independent Huffman codeword comprise reading codewords from a Huffman codebook; and
   (3) said Huffman codebook is characterized in that the length of each said rate dependent Huffman codeword is generally inversely related to the probability that the selected VQ codevector will be within the subset identified by that codeword; and the length of each said substantially rate independent Huffman codeword is generally inversely related to the probability that the particular VQ codevector identified by that codeword will be selected.

7. A system for compressing data, comprising:
   (a) a vector quantization (V Q) codebook partitioned into subsets, wherein each subset comprises codevectors and each one of said codevectors is stored at a corresponding address in said VQ codebook;
   (b) means for quantizing an input vector by representing said input vector with a VQ codeword determined on the basis of a VQ codevector selected from said VQ codebook;
   (c) means for generating a rate dependent Huffman codeword for the selected VQ codevector, wherein said rate dependent Huffman codeword identifies the subset of said VQ codebook in which the selected codevector is stored; and
   (d) means for generating a substantially rate independent Huffman codeword for the selected codevector, wherein said substantially rate independent Huffman codeword identifies a particular VQ codevector within the subset identified by said rate dependent Huffman codeword.

8. The system recited in claim 7, wherein said VQ codebook is a tree structured codebook (TSCB) and the subsets correspond to levels of the TSCB.

9. The system recited in claim 7, wherein the means for generating a rate dependent Huffman codeword and generating a substantially rate independent Huffman codeword comprise a Huffman codebook embodied in a memory and means for reading codewords from said Huffman codebook.

10. The system recited in claim 9, wherein said Huffman codebook is characterized in that the length of each said rate dependent Huffman codeword is generally inversely related to the probability that the selected VQ codevector will be within the subset identified by that codeword; and the length of each said substantially rate independent Huffman codeword is generally inversely related to the probability that the particular VQ codevector identified by that codeword will be selected.

11. The system recited in claim 7, wherein the subsets correspond to different VQ codebooks.

12. The system recited in claim 7, wherein:

(1) the VQ codebook is a tree structured codebook (TSCB) and the subsets correspond to levels of the TSCB;

(2) the means for generating a rate dependent Huffman codeword and generating a substantially rate independent Huffman codeword comprise a Huffman codebook embodied in a memory and means for reading codewords from said Huffman codebook; and (3) said Huffman codebook is characterized in that the length of each said rate dependent Huffman codeword is generally inversely related to the probability that the selected VQ codevector will be within the subset identified by that codeword; and the length of each said substantially rate independent Huffman codeword is generally inversely related to the probability that the particular VQ codevector identified by that codeword will be selected.

* * * * *

UNITED STATES PATENT AND TRADEMARK OFFICE
CERTIFICATE OF CORRECTION

PATENT NO. : 5,420,639
DATED : May 30, 1995
INVENTOR(S) : Michael G. Perkins

It is certified that error appears in the above-indentified patent and that said Letters Patent is hereby corrected as shown below:

Col. 9, line 32, "vQ" should be --VQ--.

line 42, before "codevector" delete the comma ",".

Col. 10, line 47, the "(V Q)" should be written as --(VQ)--.

Signed and Sealed this

Twenty-sixth Day of November 1996

Attest:

BRUCE LEHMAN

Attesting Officer     Commissioner of Patents and Trademarks